(12) United States Patent
Katsu

(10) Patent No.: US 6,229,084 B1
(45) Date of Patent: May 8, 2001

(54) SPACE SOLAR CELL

(75) Inventor: Tomoji Katsu, Ikoma-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/406,680

(22) Filed: Sep. 27, 1999

(30) Foreign Application Priority Data

Sep. 28, 1998 (JP) ................................................. 10-272678

(51) Int. Cl.⁷ ..................... H01L 31/068; H01L 31/0224; H01L 31/0236; H01L 31/052

(52) U.S. Cl. ........................... 136/255; 136/256; 136/258; 136/259; 136/261; 136/292; 257/436; 257/437; 257/448; 257/459; 257/461; 257/464; 257/465

(58) Field of Search ....................... 136/255, 256, 136/292, 259, 258 PC, 258 AM, 261; 257/436, 437, 448, 459, 461, 464, 465

(56) References Cited

U.S. PATENT DOCUMENTS

| | | | |
|---|---|---|---|
| 3,462,311 | * 8/1969 | Ross | 136/255 |
| 4,355,196 | 10/1982 | Chai | 136/259 |
| 5,057,163 | * 10/1991 | Barnett et al. | 136/256 |

FOREIGN PATENT DOCUMENTS

| | | |
|---|---|---|
| 3-120762 | * 5/1991 | (JP) . |
| 4-274374 | 9/1992 | (JP) . |
| 6-169096 | * 6/1994 | (JP) . |

OTHER PUBLICATIONS

Zhao et al, "24% Efficient Perl Structure Silicon Solar Cells,"Proc. of IEEE PVSC, pp. 333–335, May 1990.*

Campbell et al, "Status of Solar Cells and Modules Fabricated from Dendritic Web Silicon," IEEE Photovoltaic Specialists Conference, 18, 1985, pp. 465–469. (Month unknown).*

Zhao et al, "24% Efficient Perl Structure Silicon Solar Cells", Proc. of IEEE 21$^{st}$ PVSC, May 21–25, 1990, pp. 333–335.

Patent Abstracts of Japan, vol. 1998, No. 02 Jan. 30, 1998 for JP 09 283779A (Hitachi Ltd), Oct. 31, 1997.

Campbell R. B. et al., "Status of Solar Cells and modules Fabricated from Dendritic Web Silicon" Photovoltaic Specialists Conference, US, NY, IEEE, vol. Conf. 18, 1985, pp. 465–469 XP000132031 (Month unknown).

Zhao J. et al., "24% Efficient Perl Structure Silicon Solar Cells" Record of the Photovoltaic Specialists Conference, US, NY, IEEE, vol. Conf. 21, May 1990, pp. 333–335, XP000480308.

Patent Abstracts of Japan, vol. 018, No. 499 (E–1607), Sep. 19, 1994 for JP 06 169096 A (Sharp Corp; Others: 01), Jun. 14, 1994.

* cited by examiner

Primary Examiner—Alan Diamond
(74) Attorney, Agent, or Firm—Nixon & Vanderhye P.C.

(57) ABSTRACT

A space solar cell includes a back surface electrode formed on a back surface opposite to a light receiving surface of a semiconductor substrate, and a dielectric layer formed between the back surface electrode and the semiconductor substrate. In the space solar cell, a plurality of openings are formed in the dielectric layer for establishing an electrical connection between the back surface electrode and the semiconductor substrate, and a ratio of an area occupied by the openings relative to an area of the back surface is within a range from 0.25% to 30%.

16 Claims, 8 Drawing Sheets

APERTURE RATIO IN BACK SURFACE OXIDE FILM (%)

APERTURE RATIO IN BACK SURFACE OXIDE FILM (%)

APERTURE RATIO IN BACK SURFACE OXIDE FILM (%)

SPACE SOLAR CELL

CROSS-REFERENCES TO RELATED APPLICATIONS

This application is related to Japanese patent application No. HET 10(1998)-272678 filed on Sep. 28, 1998 whose priority is claimed under 35 USC §119, the disclosure of which is incorporated herein by reference in its entirety.

BACKGROUND OF THE INVENTION

1. Field of the Invention

The present invention relates to a space solar cell, and more particularly to a space solar cell (solar cell for space application) such as a space silicon solar cell which has good electrical output power characteristics and is suitably used under the environment of outer space.

2. Description of the Related Art

A silicon solar cell is widely used as a solar cell that converts light energy to electric energy. Such a silicon solar cell is used also under the environment of outer space such as in an artificial satellite.

FIG. 14 shows an example of a conventional silicon solar cell. This is referred to as BSR (back surface reflector) structure, where an $N^+$-type diffusion layer 2 is formed on a light receiving surface located in a front surface of a 200 $\mu$m thick P-type silicon substrate 1 by thermal diffusion of an N-type impurity ions for taking in the carriers generated by the light energy, and a light-receiving surface electrode 3 is formed in a comb-teeth shape on the $N^+$-type diffusion layer 2 for taking out the generated electricity. Further, the $N^+$-type diffusion layer 2 and the light-receiving surface electrode 3 are covered with an anti-reflection film 4 for reducing a surface reflection of incident light.

In addition, a BSR electrode 5 is formed on the back surface of the silicon substrate 1 for improving the amount of generated carriers by increasing an optical path length by reflecting a long-wavelength light that escapes away from the back surface of the solar cell. Further, a back surface electrode 6 is formed over an entire surface of the BSR electrode 5 for taking out the generated electricity. In the solar cell of this structure, a conversion efficiency is increased by allowing the light reaching the back surface of the silicon substrate 1 to be reflected by the BSR electrode 5 to take out an energy of the carries generated around the back surface effectively as an electric power.

A solar cell with further increased conversion efficiency is shown in FIG. 15 and is referred to as an NRS/BSF (non-reflective surface/back surface field) structure, where a light-receiving surface of a 100 $\mu$m thick P-type silicon substrate 1 is formed into a non-reflection configuration 7 with numerous small inverted-pyramid recesses to reduce the surface reflection of solar light by multiple reflection. This is referred to as "NRS structure". Also, an $N^+$-type diffusion layer 2 is formed on a light receiving surface side of the P-type silicon substrate 1, and a front surface oxide film 8 is formed as a front surface dielectric layer on the $N^+$-type diffusion layer 2. A light-receiving surface electrode 3 having a comb-teeth shape is connected to the $N^+$-type diffusion layer 2 via openings formed in the oxide film 8. Further, the oxide film 8 and the light-receiving surface electrode 3 are covered with an anti-reflection film 4 for reducing the surface reflection of incident light.

Further, a $P^+$-type diffusion layer 9 is formed on a back surface side of the silicon substrate 1 for allowing the carries generated in the silicon substrate 1 to move towards the $N^+$-type diffusion layer (BSF structure). A back surface oxide film is formed as a back surface dielectric layer on the $P^+$-type diffusion layer 9. The BSR electrode 5 and the back surface electrode 6 are electrically connected to the $P^+$-type diffusion layer 9 via a plurality of openings 11 formed in the oxide film 10. An internal electric field is formed by the $P^+$-type diffusion layer 9, and the carriers generated near the back surface of the silicon substrate 1 are accelerated by this electric field, whereby recombination of the carriers is prevented and the energy of the carriers can be taken out effectively as an electric power. In this structure, the photosensitivity to a long-wavelength light increases to improve the conversion efficiency.

Compared with other materials, the solar cell utilizing a silicon substrate has a high conversion efficiency and is inexpensive, so that there has been a great demand for this type of a solar cell. Especially, in a space solar cell, a further improvement of output power is required in recent years and an improvement of an electric output power has been demanded. Therefore, an improvement of the output power must be achieved also in the solar cell having the above-mentioned structure.

Thus, in order to achieve an improvement in an output power of a solar cell having a BSR structure, a back surface dielectric layer may be formed on a back surface of a silicon substrate to reduce the recombination, at the back surface, of carriers generated by the light energy, whereby the electric output power can be improved. Such a solar cell is disclosed, for example, in Japanese Unexamined Patent Publications No. HEI 04(1992)-274374 and No. HEI 06(1994)-169096.

On the other hand, in the solar cell having an NRS/BSF structure, the back surface dielectric layer is already formed on the back surface of the silicon substrate. With respect to increasing the conversion efficiency of the silicon solar cell, "Conference Record" 21th IEEE, Photovoltaic Specialists Conference, Florida, May 1990, pp. 333–335, for example, proposes a technique in which the substrate includes a plurality of locally-formed $P^+$ layers and a silicon oxide film is used as the back dielectric layer. Also, Japanese Unexamined Patent Publication No. HEI 04(1992)-15963 discloses a solar cell in which a special arrangement of diffusion layers is provided to increase the conversion efficiency.

In recent years, in addition to the increase of the conversion efficiency of a solar cell, there is also a demand for a space solar cell having good electric output power characteristics in which the radiation hardness is considered so that the solar cell can be used under the environment of outer space.

The present invention has been made in view of these circumstances, and the purpose thereof is to provide a space solar cell that can be suitably used under the environment of outer space by defining an aperture ratio in the back surface dielectric layer, thereby to improve the electric output power characteristics.

The inventors of the present invention have found out that the loss in the electric power due to series resistance can be reduced and the electric output power characteristics can be improved by defining an aperture ratio (area ratio) to be within the range from 0.25 to 30%, the aperture ratio being a ratio of the area occupied by a plurality of openings formed in the back surface dielectric layer for establishing an electrical connection between the semiconductor substrate and the back surface electrode, relative to the area of the back surface of the semiconductor substrate. This finding has lead to the present invention.

SUMMARY OF THE INVENTION

The present invention provides a space solar cell comprising a back surface electrode formed on a back surface opposite to a light receiving surface of a semiconductor substrate, and a dielectric layer formed between the back surface electrode and the semiconductor substrate, wherein a plurality of openings are formed in the dielectric layer for establishing an electrical connection between the back surface electrode and the semiconductor substrate, and a ratio of an area occupied by the openings relative to an area of the back surface is within a range from 0.25% to 30%.

BRIEF DESCRIPTION OF THE DRAWINGS

The present invention will be better understood from the following detailed description of preferred embodiments of the invention, taken in conjunction with the accompanying drawings, in which.

DETAILED DESCRIPTION OF THE PREFERRED EMBODIMENTS

Figure 1:
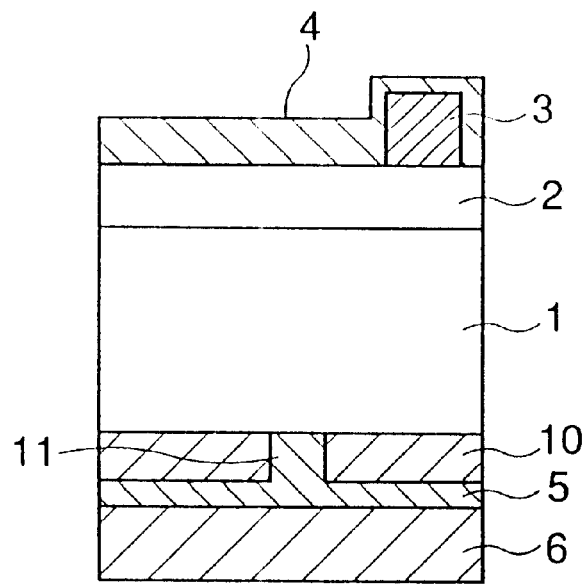
FIG. 1 is a cross-sectional view showing a solar cell having a BSR structure according to an embodiment of the present invention.

In the present invention, a dielectric layer is disposed between a back surface of a semiconductor substrate and a back surface electrode, and a plurality of openings are formed at an appropriate ratio in the dielectric layer. The area ratio of these openings (aperture ratio) maybe within the range from 0.25 to 30%, preferably with in the range from 10 to 15%, more preferably a value of 12.25%. This reduces the series resistance and improves the electric output power characteristics.

The reason why the area ratio occupied by the openings relative to the back surface of the semiconductor substrate is restricted to be within the range of 0.25 to 30% is as follows. If the ratio of the openings is larger than 30%, there will be a smaller effect produced by the dielectric layer for preventing recombination of carriers generated near the back surface of the semiconductor substrate; and moreover, since the solar light absorptivity ($\alpha$ S) increases, the operating temperature will increase and the output power at the time of actual operation will decrease. On the other hand, if the ratio is smaller than 0.25%, the series resistance will increase and the electrical output power will decrease.

In the above-mentioned construction, the openings are preferably disposed with equal spacing. In view of facility in manufacturing the solar cell, the openings preferably have a rectangular shape, more preferably a square shape. For example, the openings may have a square shape with a side of about 70 $\mu$m and maybe distribute data pitch of about 200 $\mu$m. Alternatively, the openings may have a square shape with a side of about 30 $\mu$m and may be distributed at a pitch of about 300 $\mu$m. The openings are not limited to square-shaped dots, and may be circular or polygonal dots. Also, the openings need not be arranged regularly, and may have a random configuration as long as the aperture ratio is within the defined range of 0.25 to 30%.

In the present invention, the semiconductor substrate may be an $N^+$-P-$P^+$ junction type semiconductor substrate including an $N^+$-type diffusion layer formed on a light receiving side of a P-type silicon substrate and a $P^+$-type diffusion layer formed on a back surface side of the P-type silicon substrate, or may be a $P^+$-N-$N^+$ junction type semiconductor substrate including a $P^+$-type diffusion layer formed on a light receiving side of an N-type silicon substrate and an $N^+$-type diffusion layer formed on a back surface side of the N-type silicon substrate. Further, the semiconductor substrate may be an $N^+$-P junction type semiconductor substrate including an $N^+$-type diffusion layer formed on a light-receiving side of a P-type silicon substrate, or may be a $P^+$-N junction type semiconductor substrate including a $P^+$-type diffusion layer formed on a light-receiving side of an N-type silicon substrate.

The semiconductor substrate according to the present invention may have a non-reflection configuration (textures) in which the light-receiving surface is formed to have an uneven shape.

The space solar cell according to the present invention may have any of aBSR structure, aBSFR (back surface field & reflector) structure, and an NRS/BSF structure.

The dielectric layer may be an oxide film. However, the dielectric layer is not limited to an oxide film alone, and may be a nitride film. If the oxide film is to be used, the oxide film may be an $SiO_2$ film.

The back surface electrode may include, for example, a three-layered metal laminate of Ti—Pd—Ag.

The semiconductor substrate is preferably a silicon substrate in view of the photoelectric conversion efficiency and the production costs. The semiconductor substrate preferably has a thickness within the range from 50 to 250 $\mu$m in view of the initial electric output power characteristics and the electric output power characteristics after irradiation.

The semiconductor substrate preferably has a resistivity within the range from 1 to 14 $\Omega$cm in view of the initial electric output power characteristics and the electric output power characteristics after irradiation.

Embodiments

Figure 14:
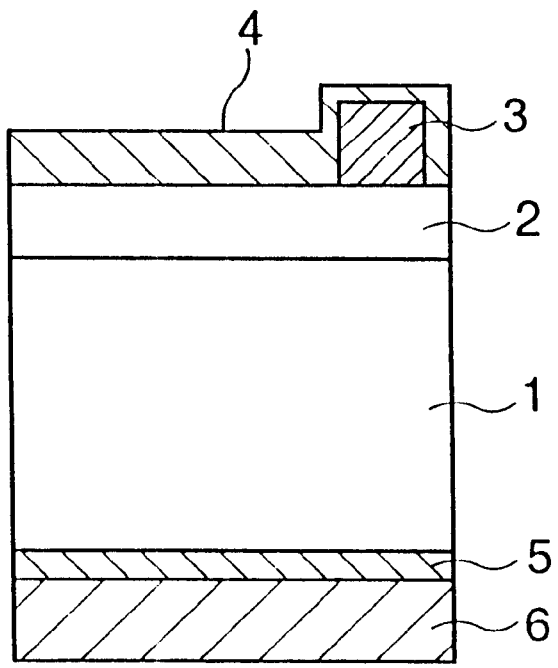
FIG. 14 is a cross-sectional view showing a conventional solar cell having a BSR structure.

FIG. 1 shows a solar cell having a BSR structure including a back surface dielectric layer (film) according to an embodiment of the present invention. The fundamental structure of this solar cell is an N+-P junction type, which is the same as that of the conventional solar cell shown in FIG. 14, wherein like numerals represent like elements in FIG. 14. A silicon substrate 1 having a thickness of 50 μm to 250 μm and a resistivity of 1 Ωcm to 14 Ωcm is used as the semiconductor substrate. For example, a P-type single crystal silicon substrate 1 having a size of 36×69 mm, a thickness of 150 μm, and a resistivity of 2 Ωcm is used as the semiconductor substrate.

In this solar cell, a BSR electrode 5 made of a metal layer such as Al or Au and a back surface electrode 6 made of a metal layer such as Ti—Pd—Ag are laminated on a back surface of the silicon substrate 1. An oxide film 10 made of, for example, $SiO_2$ and acting as a back surface dielectric layer is formed between the BSR electrode 5 and the silicon substrate 1. In the oxide film 10 are formed a plurality of openings 11 which act as contact holes for establishing an electrical connection of the silicon substrate 1 with the BSR electrode 5 and the back surface electrode 6.

Figure 2:
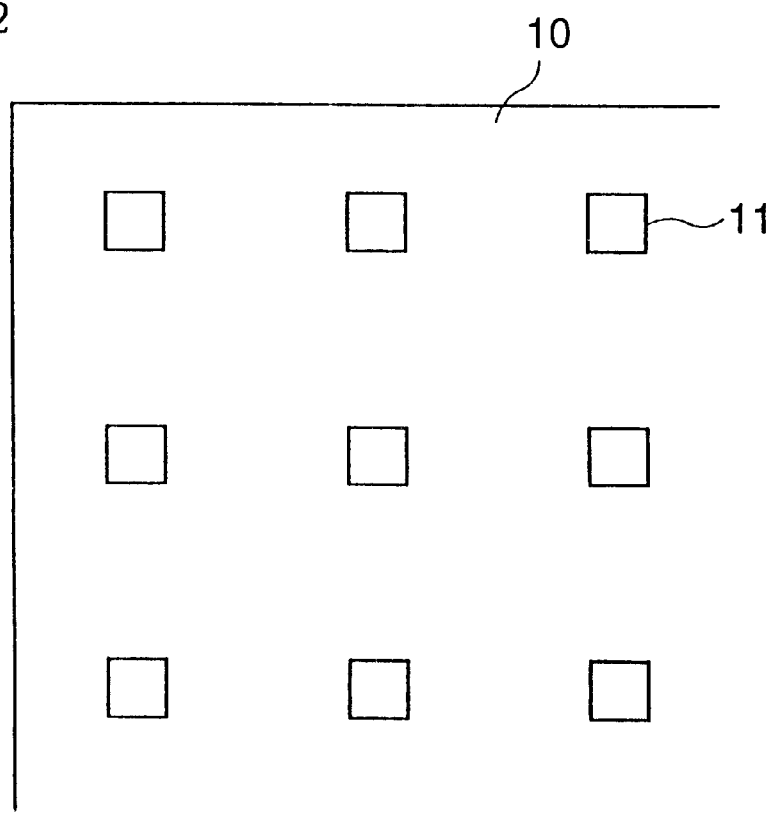
FIG. 2 is a view showing an aperture arrangement pattern.

The oxide film 10 is formed by thermal oxidation or the CVD method. The openings 11 are formed in the oxide film 10, for example, by using a photoetching technique. In these openings 11, the area ratio of the openings 11 (aperture ratio) relative to the area of the back surface of the silicon substrate 1 is set to be within the range of 0.25% to 30%. For example, referring to FIG. 2, the openings 11 are formed to have a square shape with a 70 μm side and are regularly arranged to be distributed at a pitch of 200 μm. In this case, the aperture ratio is 12.25%, as shown by the following calculation.

(70×70)/(200×200)=0.1225

Further, since the silicon substrate 1 has a size of 36 mm to 69 mm, the density of the openings 11 is as follows. In a longitudinal direction of the silicon substrate 1 are arranged 345 (=69/0.2) openings, and in a lateral direction of the silicon substrate 1 are arranged 180 (=36/0.2) openings. Therefore, the silicon substrate 1 includes a total of 62100 (=345×180) openings, whereby the density of the openings is 62100/(36 mm×69 mm)=25 openings/mm².

Figure 15:
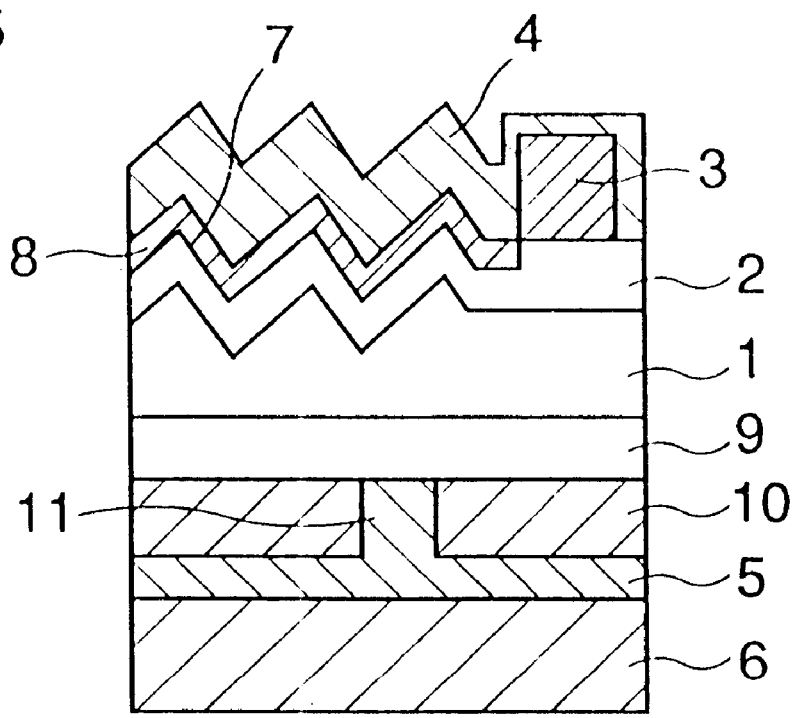
FIG. 15 is a cross-sectional view showing a conventional solar cell having an NRS/BSF structure.

Next, an embodiment will be shown in which the aperture ratio of the back surface dielectric layer in a solar cell of an NRS/BSF structure is optimized. The structure of the solar cell is an N+-P-P+ junction type which is the same as the one shown in FIG. 15. A P-type single crystal silicon substrate 1 having a size of 36 mm×69 mm, a thickness of 100 μm, and a resistivity of 2 Ωcm is used as the silicon substrate. A plurality of openings 11 are formed, for example, by using a photoetching technique in an oxide film 10 serving as a back surface dielectric layer. These openings 11 are also used as contact holes for obtaining an electrical connection of a BSR electrode 5 being a metal layer made of Al and a back surface electrode 6 being a metal layer made of Ti—Pd—Ag formed on the oxide film 10, with a P+-type diffusion layer 9 on the back surface side of the silicon substrate 1.

Figure 3:
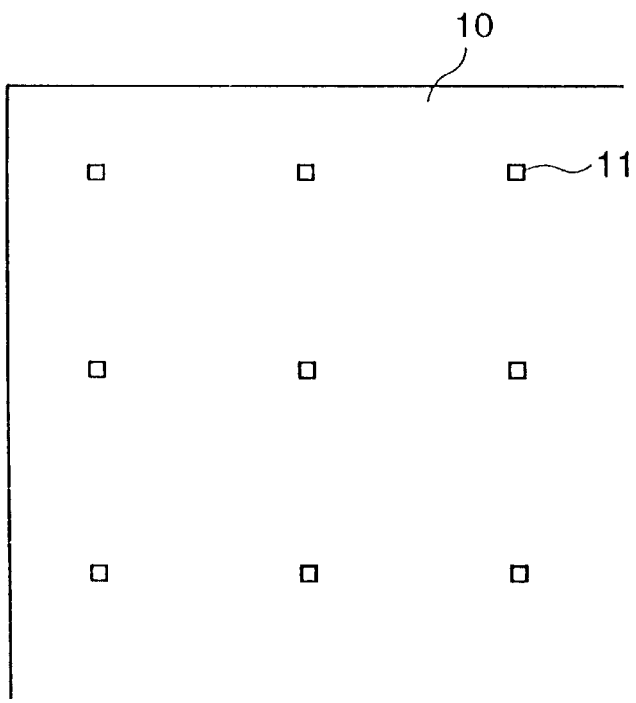
FIG. 3 is a view showing another aperture arrangement pattern.

Referring to FIG. 3, the openings 11 are formed to have a square shape with a 30 μm side and are regularly arranged to be distributed at a pitch of 300 μm. In this case, the aperture ratio is 1.0%, as shown by the following calculation.

(30×30)/(300×300)=0.01

Further, since the silicon substrate 1 has a size of 36 mm to 69 mm, the density of the openings 11 is as follows. In a longitudinal direction of the silicon substrate 1 are arranged 230 (=69/0.3) openings, and in a lateral direction of the silicon substrate 1 are arranged 120 (=36/0.3) openings. Therefore, the silicon substrate 1 includes a total of 27600 (=230×120) openings, whereby the density of the openings is 27600/(36 mm×69 mm)=11.1 openings/mm².

Here, experiments were conducted under an environment of outer space (28° C., AM0) on a solar cell having a BSR structure and a solar cell having an NRS/BSF structure in the above embodiments. Tables 1 and 2 show experimental data on the electrical output power characteristics (Isc, Voc, FF, Pmax) and the solar light absorptivities αs of the solar cell having the BSR structure and the solar cell having the NRS/BSF structure when the aperture ratio in the oxide film 10 was varied. Here, the dimension of the solar cells is 2 cm×2 cm. The environment of outer space (28° C., AM0) as used herein refers to the following environment. Also, the electrical output power characteristics were measured under the following condition.

Under environment of outer space: 28° C., AM0,
Solar light illuminance of 135.3 mW/cm²
Isc: Short circuit current
Voc: Open-circuit voltage
FF: Fill Factor (FF=Pmax/(Isc×Voc))
Pmax: Maximum output power

TABLE 1

| Aperture ratio in back surface oxide film | Isc (mA) | Voc (mV) | FF | Pmax (mW) | Solar light absorptivity (αs) |
|---|---|---|---|---|---|
| 0.25% | 161.3 | 592.2 | 0.770 | 73.6 | 0.730 |
| 12.25% | 161.2 | 593.4 | 0.785 | 75.1 | 0.736 |
| 20.25% | 161.6 | 591.8 | 0.784 | 75.0 | 0.740 |
| 30.25% | 160.8 | 587.2 | 0.779 | 73.5 | 0.750 |
| 100.00% | 159.9 | 583.5 | 0.775 | 72.3 | 0.780 |

TABLE 2

| Aperture ratio in back surface oxide film | Isc (mA) | Voc (mV) | FF | Pmax (mW) | Solar light absorptivity (αs) |
|---|---|---|---|---|---|
| 0.25% | 190.8 | 629.7 | 0.776 | 93.2 | 0.860 |
| 1.00% | 191.0 | 630.0 | 0.780 | 93.8 | 0.860 |
| 12.25% | 190.8 | 629.2 | 0.779 | 93.5 | 0.863 |
| 20.25% | 190.5 | 628.6 | 0.779 | 93.3 | 0.866 |
| 30.25% | 190.9 | 625.1 | 0.770 | 91.9 | 0.869 |
| 100.00% | 190.5 | 614.0 | 0.760 | 88.9 | 0.890 |

Figure 4:
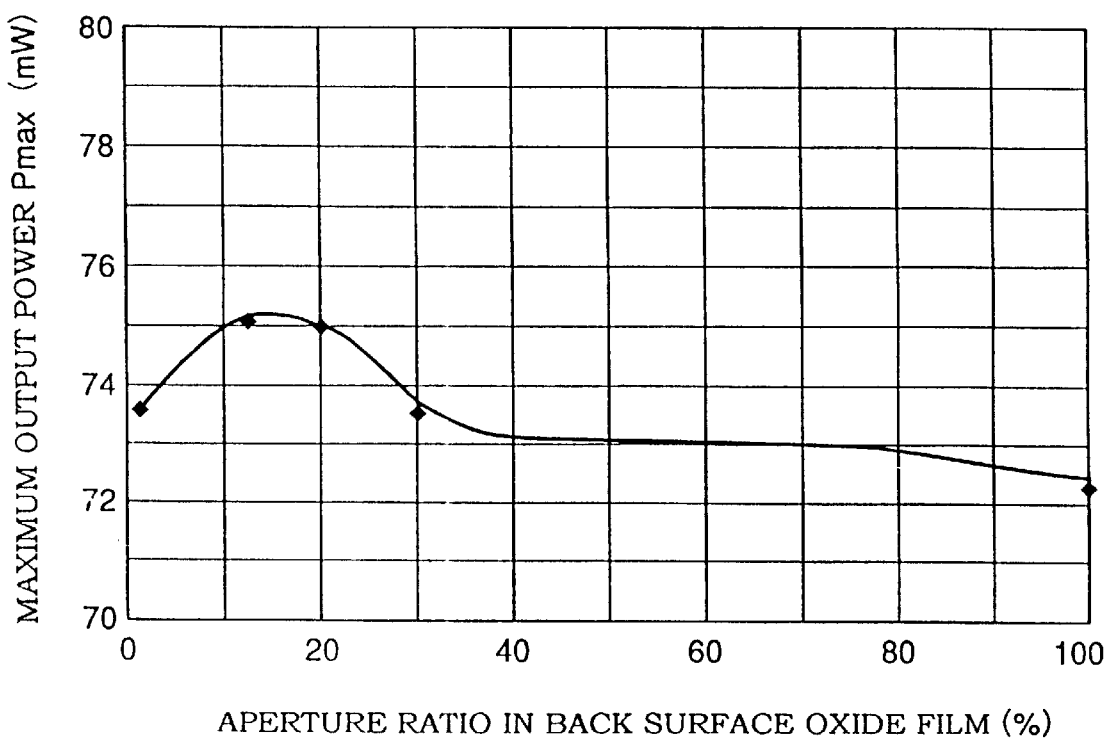
FIG. 4 is a view showing characteristics (maximum output power) of the solar cell having a BSR structure relative to the aperture ratio.
Figure 5:
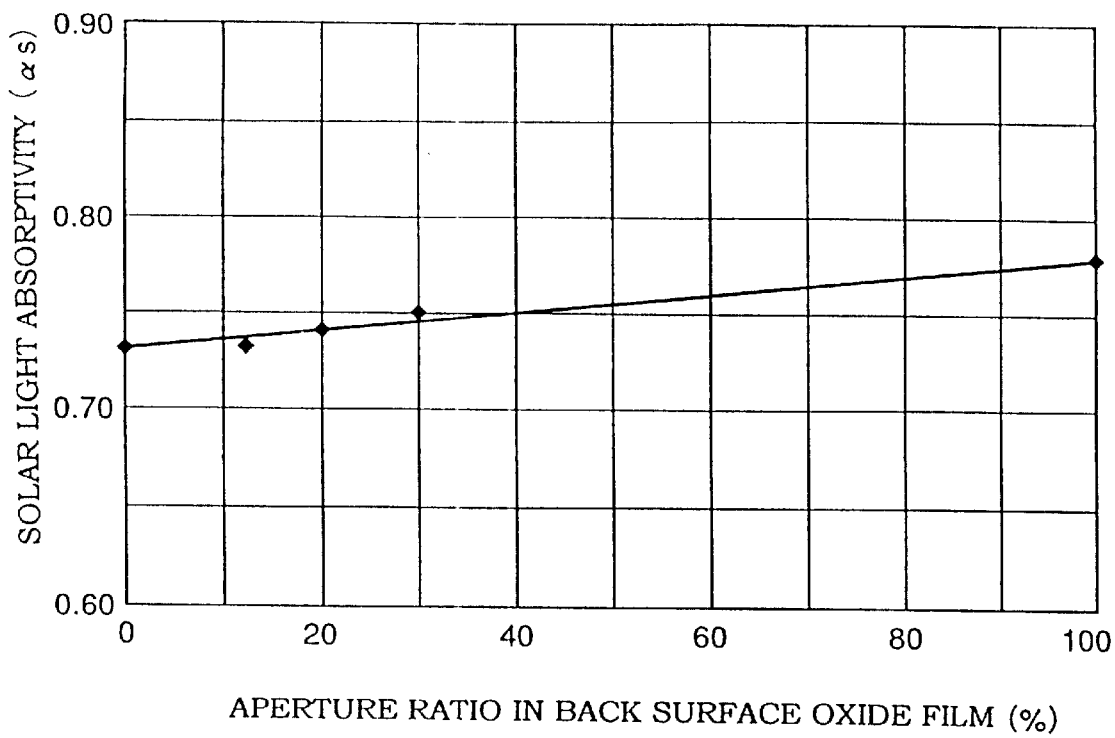
FIG. 5 is a view showing characteristics (solar light absorptivity) of the solar cell having a BSR structure relative to the aperture ratio.
Figure 6:
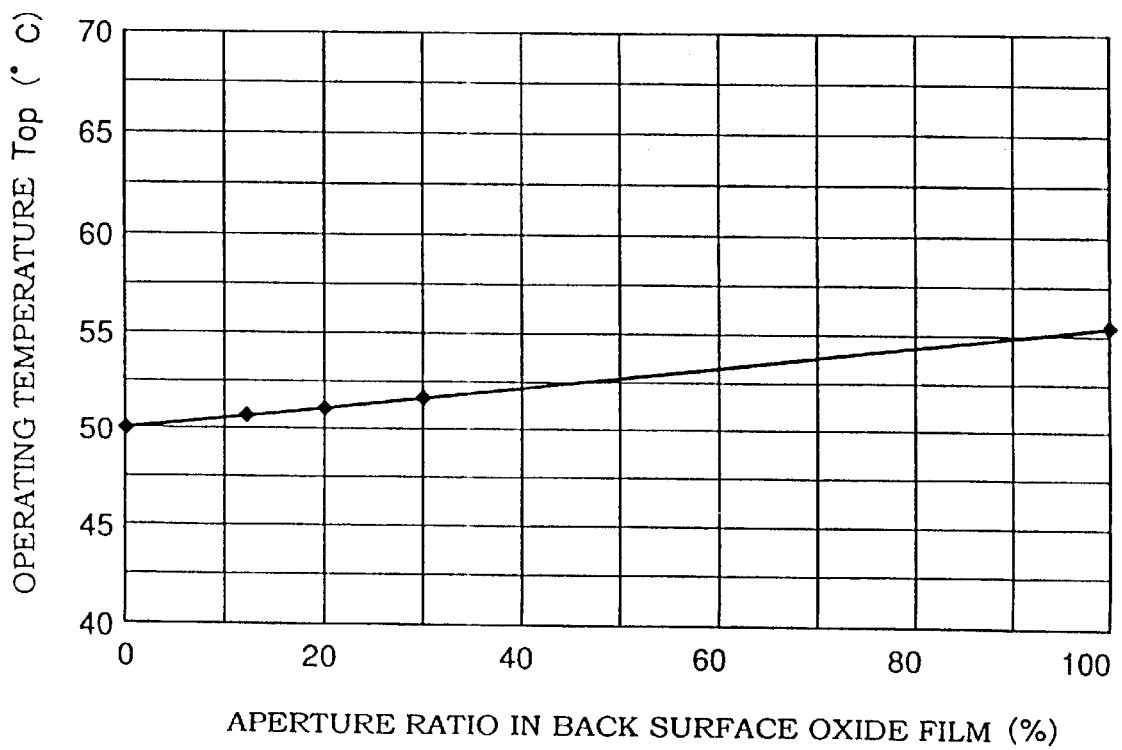
FIG. 6 is a view showing characteristics (operating temperature) of the solar cell having a BSR structure relative to the aperture ratio.
Figure 7:
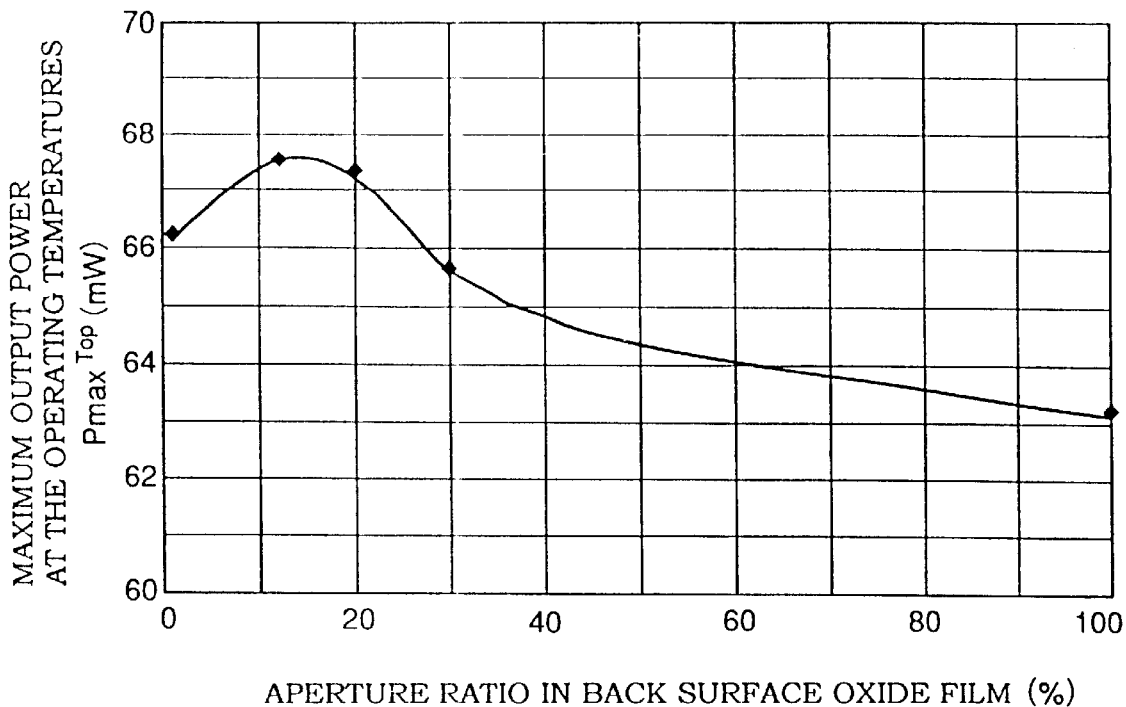
FIG. 7 is a view showing characteristics (maximum output power at the operating temperature) of the solar cell having a BSR structure relative to the aperture ratio.
Figure 8:
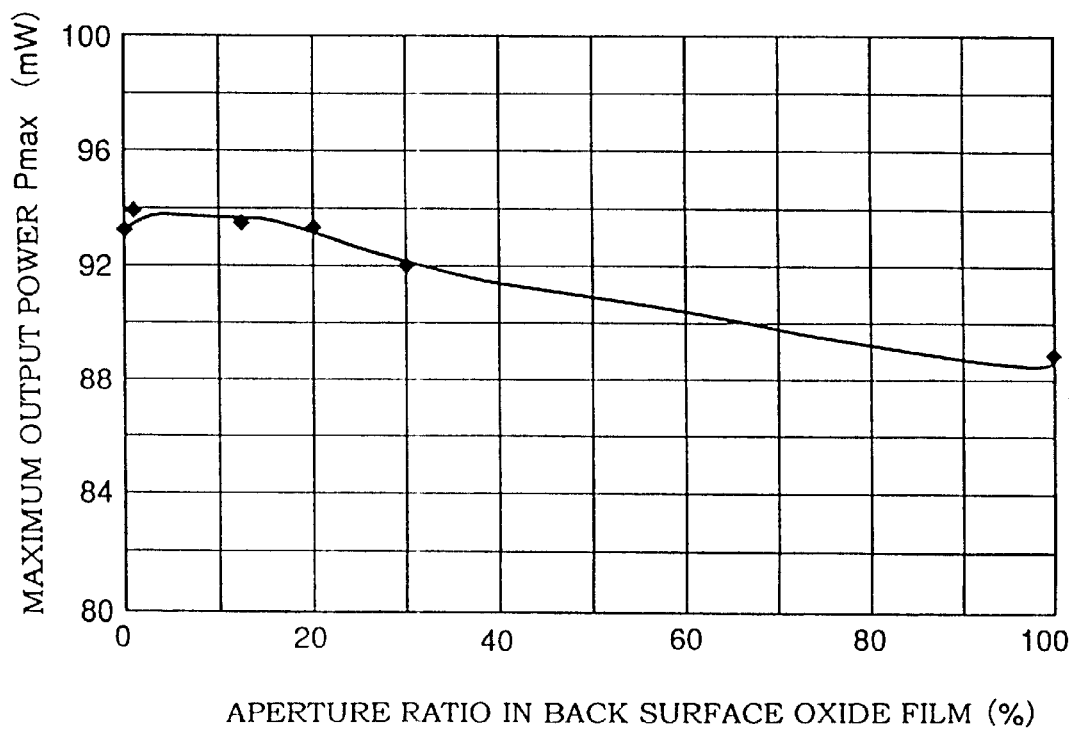
FIG. 8 is a view showing characteristics (maximum output power) of the solar cell having an NRS/BSF structure relative to the aperture ratio.
Figure 9:
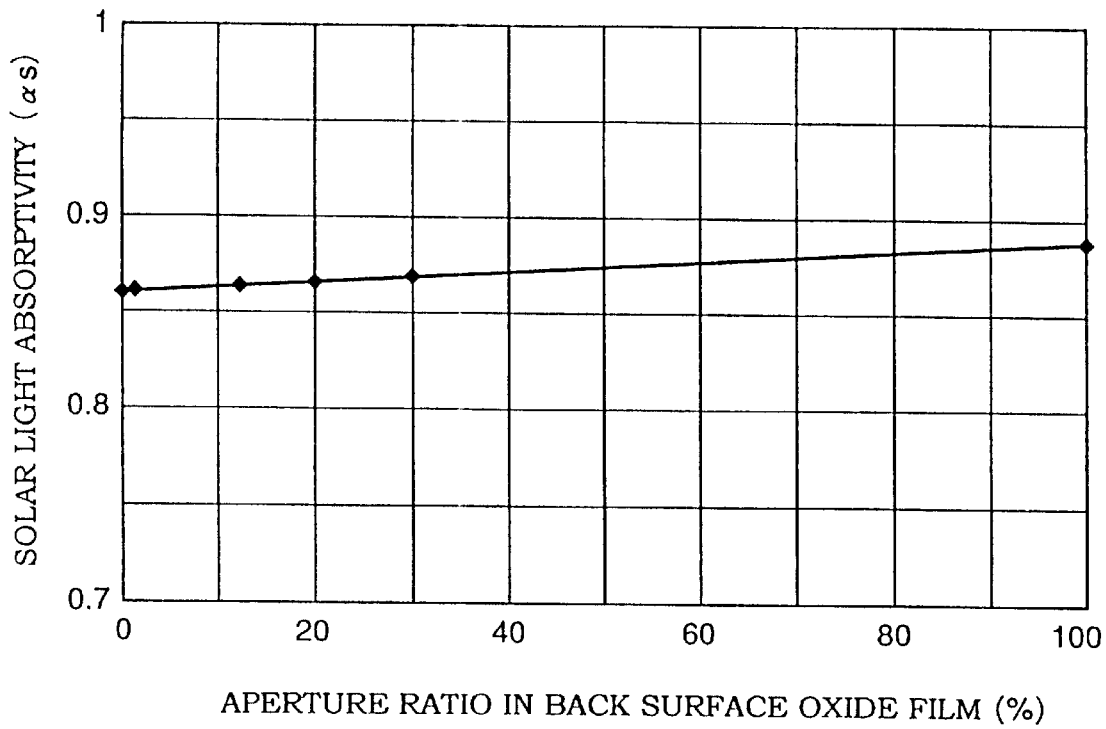
FIG. 9 is a view showing characteristics (solar light absorptivity) of the solar cell having an NRS/BSF structure relative to the aperture ratio.
Figure 10:
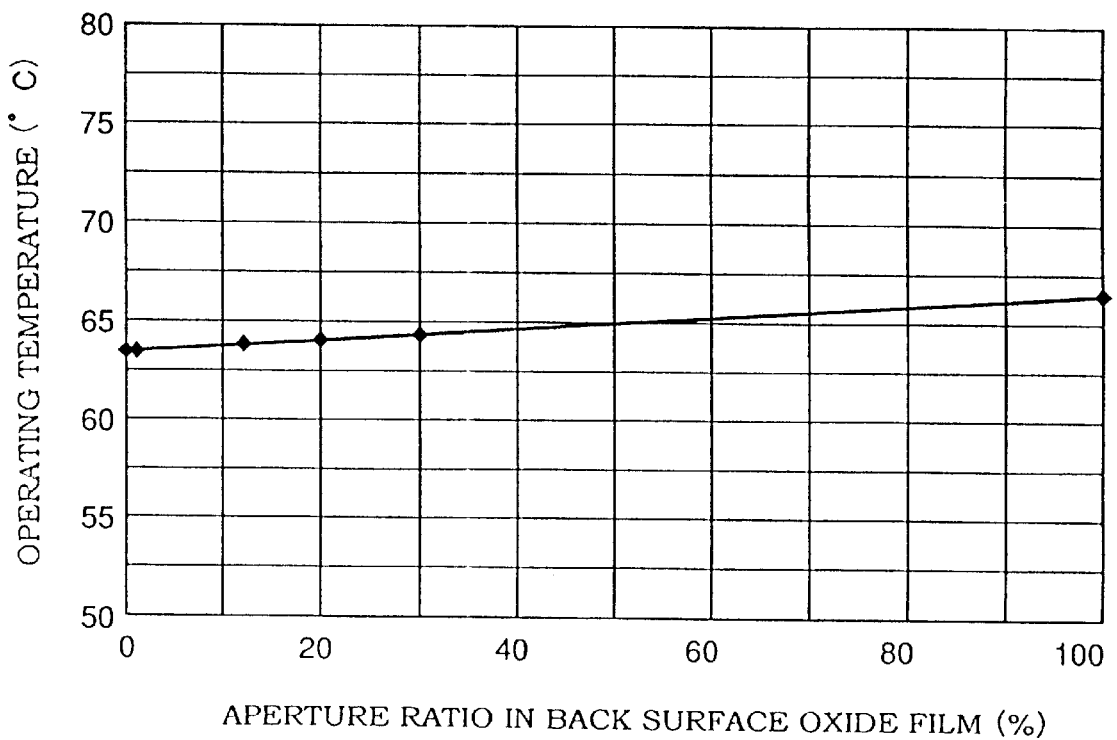
FIG. 10 is a view showing characteristics (operating temperature) of the solar cell having anNRS/BSF structure relative to the aperture ratio.
Figure 11:
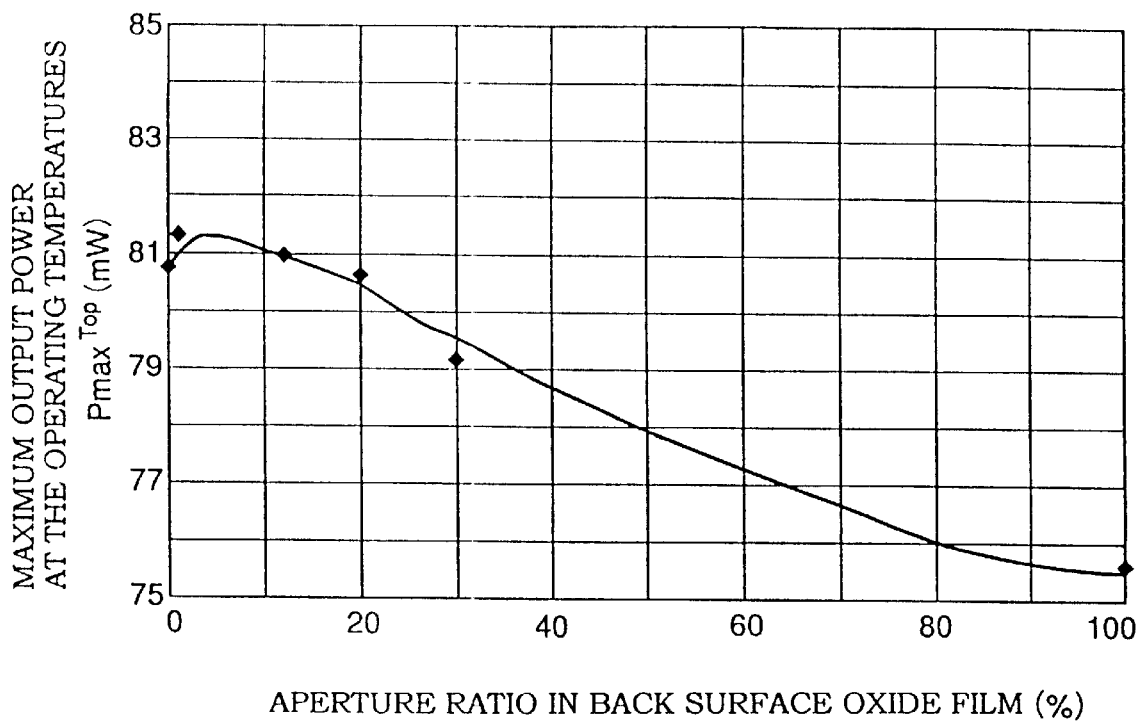
FIG. 11 is a view showing characteristics (maximum output power at the operating temperature) of the solar cell having an NRS/BSF structure relative to the aperture ratio.

FIGS. 4 and 8 show the change of the Pmax (maximum output power) relative to the aperture ratio in the oxide film 10 in the solar cells having the respective structures. FIGS. 5 and 9 show the change of the solar light absorptivities αs relative to the aperture ratio in the oxide film 10 in the solar cells having the respective structures. FIGS. 6 and 10 show the change of the operating temperatures Top relative to the aperture ratio in the oxide film 10 in the solar cells having the respective structures. FIGS. 7 and 11 show the change of the maximum output power $Pmax^{Top}$ at the operating temperatures Top relative to the aperture ratio in the oxide film 10 in the solar cells having the respective structures.

Here, the operating temperature $T_{op}$ is calculated as follows.

$$T_{op}=[\alpha s \times S/(\epsilon_{HF}+\epsilon_{HB}) \times \sigma]^{1/4}$$

$T_{op}$: operating temperature (K: absolute temperature)
αs: solar light absorptivity of solar cell
S: solar constant (W/m²)

εHF: hemispherical emissivity of front surface (solar cell) of solar cell array $\epsilon_{HB}$: hemispherical emissivity of back surface of solar cell array σ: Stefan-Boltzmann constant (W/m²·K⁴)

As will be apparent from the above experiment results, the improvement in the Pmax is considerable if the aperture ratio in the oxide film 10 is 0.25% or more and 30% or less.

The reason why the Pmax of the solar cell increases in accordance with the improvement in the Voc is that, since the Pmax is represented by Pmax=Voc×Isc×FF, the change in the Isc and the FF is comparatively small if the aperture ratio in the oxide film 10 is 0.25% or more and 30% or less, so that the Pmax is improved in accordance with the Voc.

The reason why the Pmax decreases when the aperture ratio in the oxide film 10 is 0.25% or less is that, since the aperture ratio is small, the path for taking out the generated electricity is long to generate a series resistance that causes the FF to decrease. Also, the reason why the effect of improving the Pmax is small when the aperture ratio in the oxide film 10 is 30% or more is that the contact area between the silicon substrate 1 and the oxide film 10 for preventing the recombination of the carriers generated in the silicon substrate 1 is small and the Voc improvement obtained as a prevention effect is small.

Also, as will be apparent from FIGS. 5 and 9, in accordance with the increase of the aperture ratio in the oxide film 10, the solar light absorptivity αs increases and, as will be apparent from FIGS. 6 and 19, the operating temperature also increases. Therefore, as shown in FIGS. 7 and 11, if the aperture ratio in the oxide film 10 is 0.25% or more and 30% or less, the solar light absorptivity αs and the operating temperature do not increase so much, so that the improvement in the $Pmax^{Top}$ at the operating temperature is considerable.

Thus, as the operating temperature decreases, the electric output power characteristics tend to increase. Since the operating temperature is correlated with the solar light absorptivity of the solar cell, the solar light absorptivity can be decreased and the operating temperature can be lowered by forming a back surface dielectric layer on the back surface of the silicon substrate, whereby the effect of improvement in the electric output power characteristics increases to make the solar cell suitable for use under the environment of outer space that produces a limited heat-dissipating effect.

Here, the present invention is not limited to the above-mentioned embodiments and numerous changes and modifications can of course be made to the above-mentioned embodiments within the scope of the present invention. Although a P-type silicon substrate is used in this embodiment, an N-type silicon substrate canbe used as well. If the N-type silicon substrate is used, the diffusion layer on the front surface side of the silicon substrate will be P-type and the diffusion layer on the back surface side of the silicon substrate will be N-type. In other words, a P⁺-N-N⁺ junction type or P⁺-N junction type solar cell is provided. Also, the semiconductor substrate constituting the P-N junction is not limited to a single crystal silicon substrate alone, so that polycrystal silicon or other materials can be used as well.

Figure 12:
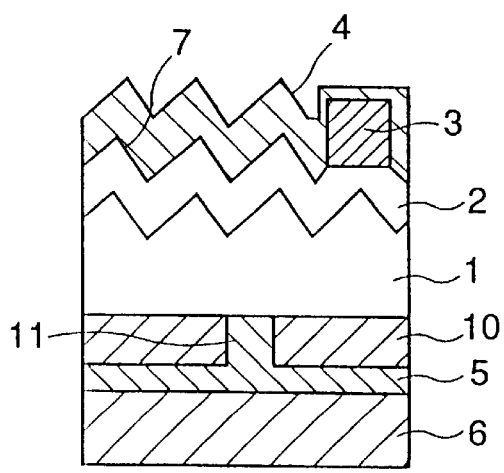
FIG. 12 is a cross-sectional view showing a solar cell having a BSR structure with a non-reflection shape.
Figure 13:
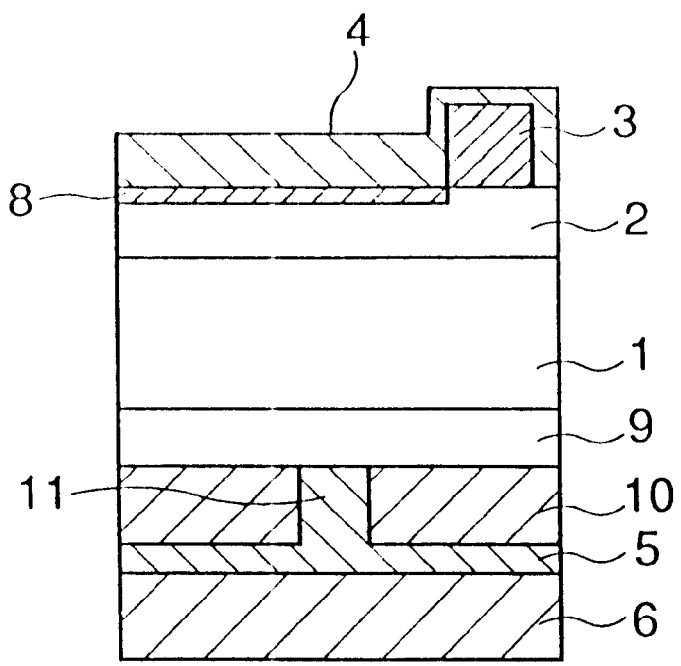
FIG. 13 is a cross-sectional view showing a solar cell having a BSFR structure having a front surface oxide film.

Further, referring to FIG. 12, the solar cell may have a structure in which a non-reflection configuration (textures) is formed on the light-receiving surface of the solar cell (in FIG. 12, a BSR structure is shown). Alternatively, referring to FIG. 13, the solar cell may have a structure in which the light-receiving surface is generally flat (in FIG. 13, a BSFR structure having a front surface oxide film is shown).

Further, the BSR electrode on the back surface may be omitted to allow the back surface electrode to be in direct contact with the dielectric layer.

In addition, the back surface dielectric layer is not limited to an oxide film alone, and may be a nitride film. Also, the openings in the back surface dielectric film need not be square-shaped dots, and may be circular or polygonal dots. Further, instead of regular arrangement, the openings may be randomly arranged as long as the aperture ratio is within the defined range of 0.25 to 30%. Also, the electrode material is not limited to the above-mentioned metal alone.

In the above, the aperture ratio of the back surface dielectric layer has been explained. Hereafter, explanation will be given on the thickness of the semiconductor substrate and the resistivity of the semiconductor substrate in the case where the aperture ratio in the back surface dielectric film is set to be 12.25% in order to adapt the solar cell of the present invention particularly for use under the environment of outer space.

A solar cell to be used under the environment of outer space (space solar cell) suffers from a large amount of irradiation in the outer space, so that the hardness against the radioactive rays is important. In this embodiment, in order to examine the relationship between the thickness of the semiconductor substrate and the radiation hardness, the relationship between the thickness of the semiconductor substrate and the electrical output power characteristics (Pmax) was examined under a condition with the electron beam radiation amount of $1\times10^{15}$ e/cm², which corresponds to 10 years in a geostationary orbit under the environment of outer space, using a solar cell having an NRS/BSF structure and a back surface dielectric layer aperture ratio of 12.25%.

As a result, it is found out that, as shown in Table 3, a thicker semiconductor substrate is more excellent from the view point of initial electrical output power characteristics, but in view of the electrical output power characteristics after the electron irradiation, a thinner semiconductor substrate is more excellent. Particularly, it is found out that, if the semiconductor substrate has a thickness of 300 μm or more, the electrical output power characteristics decrease considerably after the electron irradiation. Further, if the semiconductor substrate has a thickness of 50 μm or less, the yield of good products decreases. For this reason, the semiconductor substrate of a solar cell for use under the environment of outer space preferably has a thickness of 50 to 250 μm in view of the endurance against the radioactive rays under the environment of outer space.

TABLE 3

| Thickness of semiconductor substrate | Initial electric Property (Pmax) | Electric Property (Pmax) after irradiation of 1 MeV electrons with $1 \times 10^{15}$ e/cm² |
|---|---|---|
| 100 μm | 93.8 (mW) | 70.3 (mW) |
| 200 μm | 97.4 (mW) | 70.1 (mW) |
| 250 μm | 98.5 (mW) | 69.9 (mW) |
| 300 μm | 99.2 (mW) | 68.4 (mW) |
| 350 μm | 99.3 (mW) | 66.5 (mW) |

Next, in order to examine the relationship between the resistivity of the semiconductor substrate and the radiation hardness, the relationship between the resistivity of the semiconductor substrate and the electrical output power characteristics (Pmax) was examined under a condition of 1 MeV electron $1\times10^{15}$ e/cm² irradiation, which corresponds to 10 years in a geostationary orbit under the environment of outer space, using a solar cell having a BSFR structure with the semiconductor substrate having a thickness of 100 μm and a back surface dielectric layer aperture ratio of 12.25%.

As a result of this, it has been found out that, as shown in Table 4, a lower resistivity is more excellent in view of the initial electrical output power characteristics but, in view of the electrical output power characteristics after the electron irradiation, the one having a resistivity of 10 Ωcm is more excellent. Also, it has been found out that the one having a resistivity of 150 Ωcm has both lower initial electrical output power characteristics and lower electrical output power characteristics after the electron irradiation, so that it is not suitable for use under the environment of outer space. Accordingly, considering the fact that the resistivity of 2 Ωcm is a central value of a specification of 1 to 3 Ωcm and the resistivity of 10 Ωcm is a central value of a specification of 7 to 14 Ωcm, the resistivity of the semiconductor substrate is preferably 1 to 14 Ωcm in order to use the solar cell under the environment of outer space.

TABLE 4

| Resistivity of semiconductor substrate | Initial electric Property (Pmax) | Electric Property (Pmax) after irradiation of 1 MeV electrons with $1 \times 10^{15}$ e/cm$^2$ |
|---|---|---|
| 2 Ωcm | 80.0 (mW) | 53.6 (mW) |
| 10 Ωcm | 79.5 (mW) | 55.7 (mW) |
| 150 Ωcm | 76.1 (mW) | 54.8 (mW) |

It has been found out from the above embodiment that a more excellent radiation hardness is obtained according as the semiconductor substrate has a smaller thickness. Also, the endurance against radioactive rays is especially excellent if the semiconductor substrate has a resistivity around 10 Ωcm.

Therefore, as a space solar cell, the thickness of the semiconductor substrate is preferably as small as possible in view of the endurance against radioactive rays and the reduction of weight, because a thinner substrate leads to reduction of weight of an artificial satellite.

As for the resistivity of the semiconductor substrate, the resistivity is preferably lower in view of the initial electrical output power characteristics but is preferably around 10 Ωcm in view of the endurance against irradiation. Therefore, it is necessary to select a semiconductor substrate having a resistivity that can ensure a predetermined minimum electrical output power at the last life stage of the artificial satellite, considering the amount of exposure of the artificial satellite to irradiation.

As shown and described above, according to an embodiment of the present invention, a plurality of openings for establishing an electrical connection between the back surface electrode and the semiconductor substrate are formed in the dielectric layer which is provided on the back surface of the semiconductor substrate for improvement of the electrical output power characteristics. By defining the area ratio of these openings to be within a predetermined range, the maximum output power increases to produce a good output. Therefore, a space solar cell with improved electric output power characteristics can be obtained.

Further, if the openings are regularly arranged to be distributed with an equal spacing, the effect of providing the dielectric layer will be great to prevent recombination of the carriers, whereby the output power will increase and the conversion efficiency will be improved.

In addition, since the solar light absorptivity can be reduced, the operating temperature decreases and the maximum output power at the operating temperature is further improved. Therefore, a solar cell suitable for use under the environment of outer space can be provided.

Furthermore, a space solar cell having a high output power and an excellent radiation hardness can be obtained by setting the thickness of the semiconductor substrate to be within the range of 50 to 250 μm and setting the resistivity of the semiconductor substrate to be within the range of 1 to 14 Ωcm.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

What is claimed is:

1. A space solar cell, comprising:

a semiconductor substrate including a crystalline silicon wafer which functions as an active layer, said semiconductor substrate including a first diffusion layer on a light receiving surface thereof;

a light receiving side electrode formed on at least part of said first diffusion layer of said semiconductor substrate;

a dielectric layer formed on a back surface of said semiconductor substrate;

a back surface electrode formed on the dielectric layer;

wherein a plurality of openings are formed in the dielectric layer for establishing an electrical connection between the back surface electrode and the semiconductor substrate, and a ratio of the area occupied by the openings relative to the area of the back surface of the semiconductor substrate is within a range from 10% to 30% in a manner such that recombination of minority carriers on the back surface of the semiconductor substrate is effectively inhibited; and wherein the back surface of the semiconductor substrate is characterized by one of: (i) the semiconductor substrate includes a second diffusion layer on its entire back surface, and (ii) the entire back surface of the semiconductor substrate directly contacts said dielectric layer and material in said openings therein with no diffusion layer therebetween.

2. A space solar cell according to claim 1, wherein the openings are arranged with equal spacing.

3. A space solar cell according to claim 1, wherein the semiconductor substrate is an N$^+$-P-P$^+$ junction type semiconductor substrate including an N$^+$-type diffusion layer formed on a light receiving side of a P-type silicon substrate and a P$^+$-type diffusion layer formed on a back surface side of the P-type silicon substrate, or is a P$^+$-N-N$^+$ junction type semiconductor substrate including a P$^+$-type diffusion layer formed on a light receiving side of an N-type silicon substrate and an N$^+$-type diffusion layer formed on a back surface side of the N-type silicon substrate.

4. A space solar cell according to claim 1, wherein the semiconductor substrate is an N$^+$-P junction type semiconductor substrate including an N$^+$-type diffusion layer formed on a light-receiving side of a P-type silicon substrate, or is a P$^+$-N junction type semiconductor substrate including a P$^+$-type diffusion layer formed on a light-receiving side of an N-type silicon substrate.

5. A space solar cell according to claim 3, wherein the light-receiving surface of the semiconductor substrate is formed in an uneven shape.

6. A space solar cell according to claim 1, wherein the openings have a rectangular shape.

7. A space solar cell according to claim 6, wherein the openings have a square shape with a side of about 70 μm and are distributed at a pitch of about 200 μm.

8. A space solar cell according to claim 6, wherein the openings have a square shape with a side of about 30 μm and are distributed at a pitch of about 300 μm.

9. A space solar cell according to claim 1, wherein the space solar cell has one of a BSR structure, a BSFR structure, and an NRS/BSF structure.

10. A space solar cell according to claim 1, wherein the back surface electrode comprises a three-layered metal laminate of Ti—Pd—Ag.

11. A space solar cell according to claim 1, wherein the semiconductor substrate has a thickness of 50 to 250 μm and a resistivity of 1 to 14 Ωcm.

12. The solar cell of claim 1, wherein the range is from 10% to 15%.

13. A space solar cell, comprising:
- a back surface electrode formed on a back surface opposite to a light receiving surface of a semiconductor substrate; and
- a dielectric layer formed between the back surface electrode and the semiconductor substrate, wherein a plurality of openings are formed in the dielectric layer for establishing an electrical connection between the back surface electrode and the semiconductor substrate, and a ratio of the area occupied by the openings relative to the area of the back surface of the semiconductor substrate is within a range from 10% to 30%.

14. The solar cell of claim 13, wherein the range is from 10% to 15%.

15. The solar cell of claim 13, wherein the back surface of the semiconductor substrate is characterized by one of: (i) the semiconductor substrate includes a second diffusion layer on its entire back surface, and (ii) the entire back surface of the semiconductor substrate directly contacts said dielectric layer and material in said openings therein with no diffusion layer therebetween.

16. The solar cell of claim 13, further comprising a second diffusion layer provided across the back surface of said semiconductor substrate.

* * * * *